(12) United States Patent
van den Boom et al.

(10) Patent No.: US 8,757,873 B2
(45) Date of Patent: Jun. 24, 2014

(54) METHOD OF MEASURING THE TEMPERATURE OF A SAMPLE CARRIER IN A CHARGED PARTICLE-OPTICAL APPARATUS

(75) Inventors: Stephanus Hubertus Leonardus van den Boom, Geldrop (NL); Pleun Dona, Veldhoven (NL); Laurens Franz Taemsz Kwakman, Saint Ismier (FR); Uwe Luecken, Eindhoven (NL); Hervé-William Rémigy, Eindhoven (NL); Hendrik Nicolaas Slingerland, Venlo (NL); Martin Verheijen, Geldrop (NL); Gerbert Jeroen van de Water, Breugel (NL)

(73) Assignee: FEI Company, Hillsboro, OR (US)

( * ) Notice: Subject to any disclaimer, the term of this patent is extended or adjusted under 35 U.S.C. 154(b) by 355 days.

(21) Appl. No.: 13/304,181

(22) Filed: Nov. 23, 2011

(65) Prior Publication Data

US 2012/0128028 A1 May 24, 2012

Related U.S. Application Data

(60) Provisional application No. 61/417,014, filed on Nov. 24, 2010.

(30) Foreign Application Priority Data

Nov. 24, 2010 (EP) .................................... 10192354

(51) Int. Cl.
*G01K 1/00* (2006.01)
*G01K 13/12* (2006.01)
*G01K 11/00* (2006.01)
*G01K 11/20* (2006.01)
*G01K 5/68* (2006.01)
*H01J 37/20* (2006.01)
*H01J 37/26* (2006.01)

(52) U.S. Cl.
CPC *G01K 5/68* (2013.01); *G01K 11/20* (2013.01); *H01J 37/20* (2013.01); *H01J 2237/2001* (2013.01); *H01J 37/26* (2013.01); *H01J 2237/24585* (2013.01)
USPC .......................................... 374/159; 374/100

(58) Field of Classification Search
USPC .................................................. 374/159, 100
See application file for complete search history.

(56) References Cited

U.S. PATENT DOCUMENTS 5,366,292 A 11/1994 Voss
(Continued)

FOREIGN PATENT DOCUMENTS

WO 2009116696 9/2009

OTHER PUBLICATIONS

Bednarz, M. et al., "Intraband relaxation and temperature dependence of the fluorescence decay time of one-dimensional Frenkel excitons: The Pauli master equation approach," Journal of Chemical Physics, Oct. 1, 2002, pp. 6200-6213, vol. 117, No. 13.

(Continued)

*Primary Examiner* — Lisa Caputo
*Assistant Examiner* — Jamel Williams
(74) *Attorney, Agent, or Firm* — Scheinberg & Assoc., PC; Michael O. Scheinberg

(57) ABSTRACT

A method of determining the temperature of a sample carrier in a charged particle-optical apparatus, characterized in that the method comprises the observation of the sample carrier with a beam of charged particles, the observation giving information about the temperature of the sample carrier. The invention is based on the insight that a charged particle optical apparatus, such as a TEM, STEM, SEM or FIB, can be used to observe temperature related changes of a sample carrier. The changes may be mechanical changes (e.g. of a bimetal), crystallographic changes (e.g. of a perovskite), and luminescent changes (in intensity or decay time). In a preferred embodiment the sample carrier shows two bimetals, showing metals with different thermal expansion coefficients, bending in opposite directions. The distance between the two bimetals is used as a thermometer.

17 Claims, 2 Drawing Sheets

(56) References Cited

U.S. PATENT DOCUMENTS

| | | | |
|---|---|---|---|
| 5,780,727 A * | 7/1998 | Gimzewski et al. | 73/105 |
| 5,986,270 A | 11/1999 | Bormans et al. | |
| 6,356,683 B1 * | 3/2002 | Hu et al. | 385/37 |
| 7,331,709 B2 * | 2/2008 | Bando et al. | 374/201 |
| 7,420,184 B2 | 9/2008 | van de Water et al. | |
| 7,513,685 B2 | 4/2009 | Egami et al. | |
| 7,604,398 B1 | 10/2009 | Akers et al. | |
| 2005/0238082 A1 * | 10/2005 | Bando et al. | 374/201 |
| 2011/0079710 A1 | 4/2011 | Damiano, Jr. et al. | |
| 2013/0105706 A1 * | 5/2013 | Han et al. | 250/442.11 |

OTHER PUBLICATIONS

Yang, H.X. et al., "Phase separation, effects of magnetic field and high pressure on charge ordering in y-Na0.5CoO2," Materials Chemistry and Physics, Nov. 14, 2005, pp. 119-124; vol. 94, Issue 1.

* cited by examiner

METHOD OF MEASURING THE TEMPERATURE OF A SAMPLE CARRIER IN A CHARGED PARTICLE-OPTICAL APPARATUS

This application claims priority from U.S. Provisional Application 61/417,014, filed Nov. 24, 2010, which is hereby incorporated by reference.

TECHNICAL FIELD OF THE INVENTION

The invention relates to a method of determining the temperature of a sample carrier in a charged particle-optical apparatus. The invention further relates to a sample carrier equipped for performing the method.

BACKGROUND OF THE INVENTION

A method of determining the temperature of a sample carrier in a charged particle-optical apparatus is known from the Gatan 914 High Tilt Liquid Nitrogen Cryo Transfer Tomography Holder, commercially available from Gatan Inc., Pleasanton, Calif., USA. This holder is used for cryotomography in a Transmission Electron Microscope (TEM) or Scanning Transmission Electron Microscope (STEM), and is equipped to hold sample carriers ("grids") which in turn carry a sample. According to the manufacturer the temperature of the holder is monitored by a calibrated silicon diode that provides a sensitive, linear temperature response. This diode is located in the sample holder.

A disadvantage of said measurement method is that the measurement measures the temperature of a part removed from the sample itself: the temperature of a part of the sample holder is measured, in which the sample carrier is clamped. The sample carrier is typically a perforated copper foil with a diameter of 3 mm diameter and a thickness of 20 µm or less. The temperature of the region of interest on the thin foil can thus differ from the temperature measured by the measuring diode.

Another disadvantage of the measurement is that the measurement comprises feeding a current through the diode and measuring the voltage over the diode. The measurement thus raises the temperature of the diode by Ohmic heating, which is, especially at cryogenic temperatures, unwanted.

Yet another disadvantage of said method is that the use of the diode implies that thin wires must be introduced in the sample holder, a side-entry type holder, which results in a complex product with high costs.

Another known method is the measurement of the temperature using a pyrometer. This method of measuring temperatures is known per se.

A disadvantage of this method is that, as known to the person skilled in the art, this method is well suited for measuring temperatures above, for example, 500° C., but is not suited for measuring at room temperatures, and even less at cryogenic temperatures.

Another disadvantage is that an optical transparent window with a view to the sample must be available to enable the pyrometer to view the sample. Especially in a STEM or a TEM, where the sample is placed between the pole pieces of the so-called objective lens, this volume between the pole pieces is at a premium, as is access to said volume.

It is mentioned that sample inspection at cryogenic temperatures is, as known to the skilled artisan, important for inspecting biological samples, for example to reduce damage to the samples and to eliminate the otherwise needed embedding in resin.

It is noted that a method is known from U.S. Pat. No. 7,331,709 disclosing a carbon nanotube with a diameter of between 40 and 150 nm and a length of between 1 and 10 µm. The carbon nanotube is closed at one end and encloses a small droplet or column of gallium. To measure a temperature in the range of 50° C. to 500° C. the carbon nanotube together with the column of gallium is brought to the specimen to be measured, the specimen located in atmosphere. As a result, a cap of oxidized gallium is formed in the carbon nanotube, that stays in position after cooling down. The position of the cap can be determined by a TEM (it is noted that a carbon nanotube is transparent to the electrons). The position is linked to the temperature at which the cap is formed by the thermal expansion coefficient of gallium, and thus the temperature difference between the temperature at which the TEM measures the position and the temperature at which the cap is formed (or at least pushed in position) is determined.

As this method is based on oxidizing gallium in an atmospheric environment, it is not suited to be used in the vacuum of a particle-optical apparatus.

SUMMARY OF THE INVENTION

Embodiments of the present invention provide a method for measuring temperature of a sample carrier free of said problems.

To that end, the method according to one or more embodiments of the present invention is characterized in that the method comprises the observation of the sample carrier with a beam of charged particles, the observation giving information about the temperature of the sample carrier.

Inventors realized that the apparatus in which the method is used, such as a Scanning Electron Microscope (SEM), a Scanning Transmission Electron Microscope (STEM), a Transmission Electron Microscope (TEM), or a Focused Ion Beam apparatus (FIB), is very well suited to observe phenomena on a sample carrier. Embodiments of the present invention are based on the insight that, by observing a temperature dependent phenomenon, such as a displacement based on thermal expansion, or crystallographic changes, the temperature can be determined.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The invention is now elucidated using figures, in which corresponding parts are indicated using corresponding reference symbols. In this.

DETAILED DESCRIPTION

Figure 1:
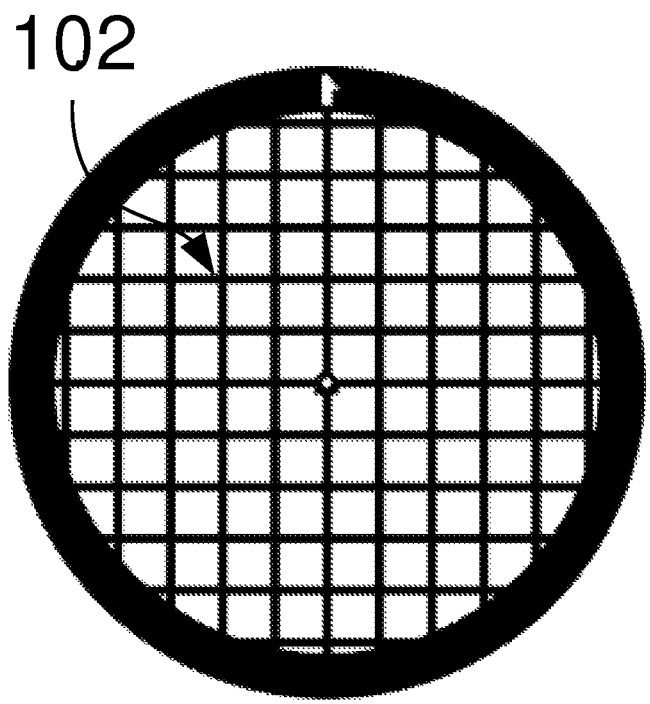
FIG. 1 schematically shows a sample carrier for use in a TEM.

In a preferred embodiment a part of the sample carrier is formed as for example a strip with two or more different materials showing different expansion coefficients, resulting in a bimetal like bending of said strip as the temperature changes. This bending thus results in a temperature dependent displacement of the end of the strip compared to another part of the sample carrier. It is noted that, although a bimetal is a well-known example showing this behavior, strictly spoken is need not be two layers, but may comprise more than two layers, nor need it be metals, but may be any combination of materials with different thermal expansion coefficients.

Preferably the strip is a bimetallic strip, in which one material is the base metal of the sample carrier itself, normally copper, with a plating of a metal such as chromium, platinum, or tungsten which have good bimetallic properties with the substrate metal (highest expansion coefficient difference). This results in a sample carrier that shows good electric conductivity (and thus no charging) and high thermal displacement.

Materials that show one or more phase transitions or phase segregations within a temperature range of interest can be used to indicate whether the temperature is above or below the phase transition temperature. It is mentioned that for example a TEM is capable to determine the phase of a material by determining a diffraction pattern of said material. An example of such a material is a material from the group of perovskites, $SrTiO_3$. This material shows a phase transition at 105 K, showing a cubic crystal above said temperature and a tetragonal structure below said temperature.

Another such material is $Na_{0.5}CoO_2$, see e.g. "Phase separation, effects of magnetic field and high pressure on charge ordering in $\gamma$-$Na_{0.5}CoO_2$", H. X. Yang et al., Materials Chemistry and Physics 94 (2005) 119-124. Another such temperature dependent phenomenon is the decay time of luminescent materials. This is described in e.g. "Intraband relaxation and temperature dependence of the fluorescence decay time of one-dimensional Frenkel excitons: The Pauli master equation approach", M. Bednarz et al., J. Chem. Phys., Vol. 117, No. 13 (1 Oct. 2002), pp. 6200-6213.

It is mentioned that a phase change is often accompanied with a volumetric change, and can thus give rise to, for example, bending of parts analogous to the bending described for bimetals.

Also, the relative luminosity of a fluorescent materials may be temperature dependent, as described in U.S. Pat. No. 7,513,685: "Temperature sensitive paint for an extended temperature range," which discloses a paint comprising two fluorescent materials.

It is mentioned that fluorescent material can be stimulated by charged particles. It is noted that the sensitivity of these methods can be improved by comparing the luminosity or decay time of a mixture of two fluorescent materials, each showing fluorescence at a different color. It is further noted that fluorescence should be construed broadly, and in this context includes phosphorescence.

Also measuring the stress and/or strain induced in a material can be an indication of the temperature of the sample carrier. Such temperature induced stress and strain can be the result of plastic deformation, or of crystallographic changes. Strain can be deduced from, for example, a diffraction pattern.

When a beam of charged particles is intercepted by the sample carrier, a potential is introduced to the part of the sample carrier intercepting the beam. By observing this potential, information about the conductivity can be gathered. As well known, the resistivity of a material can be highly temperature dependent, especially when phase changes occur. A well-known example is the onset of superconductivity at a temperature below a critical temperature. It is mentioned that such a potential can be observed by the deflection of the passing beam of charged particles that such a potential introduces.

It is mentioned that in some of the above mentioned cases it is only determined whether the sample carrier has a temperature above or below a critical temperature (for example the temperature at which a phase change occurs), and in other cases an analog or more gradual representation can be obtained, for example when determining the bending of a bimetal.

FIG. 1 shows a typical sample carrier for use in a TEM. The sample carrier, also known as a "grid", is typically made of a copper foil with a thickness of between 20 and 30 μm, although also grids with a thickness as low as 6 μm are available. The grid has an outer diameter of 3.05 mm. It shows a large number of apertures, over which a sample can be draped. The grids are available in a large variety of meshes, ranging from approximately 2 bars/mm (50 lines per inch) to approximately 400 bars/mm (2000 lines per inch). FIG. 1 shows such a grid with an intersection 102 where a horizontal and a vertical bar intersect.

It is noted that copper grids are most common, but also gilded copper grids are known, as are nickel, gold, copper/palladium, Nylon, and carbon grids, as well as copper grids with carbon foil or a layer of SiN over the apertures (for extra support of the sample), and grids with non-square mesh, such as a rectangular or a hexagonal mesh.

Figure 2A:
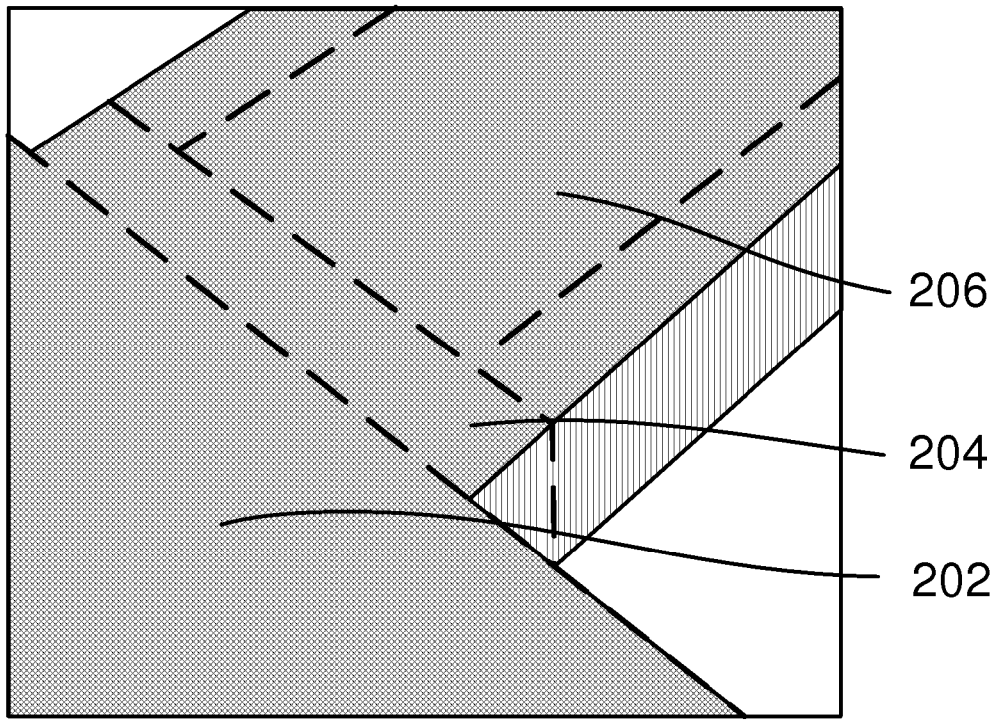
FIG. 2a schematically shows a detail of the sample carrier shown in FIG. 1.

FIG. 2a schematically shows the crossing 102 shown in FIG. 1. The grid is now plated with a material with an thermal expansion coefficient different from that of the base material, such as plating a copper grid with nickel. Finally the connection 204 between a bar 202 and a perpendicular bar is removed, and the free standing bar is split in two by removing area 206. As a result a prong is formed with two tines.

Figure 2B:
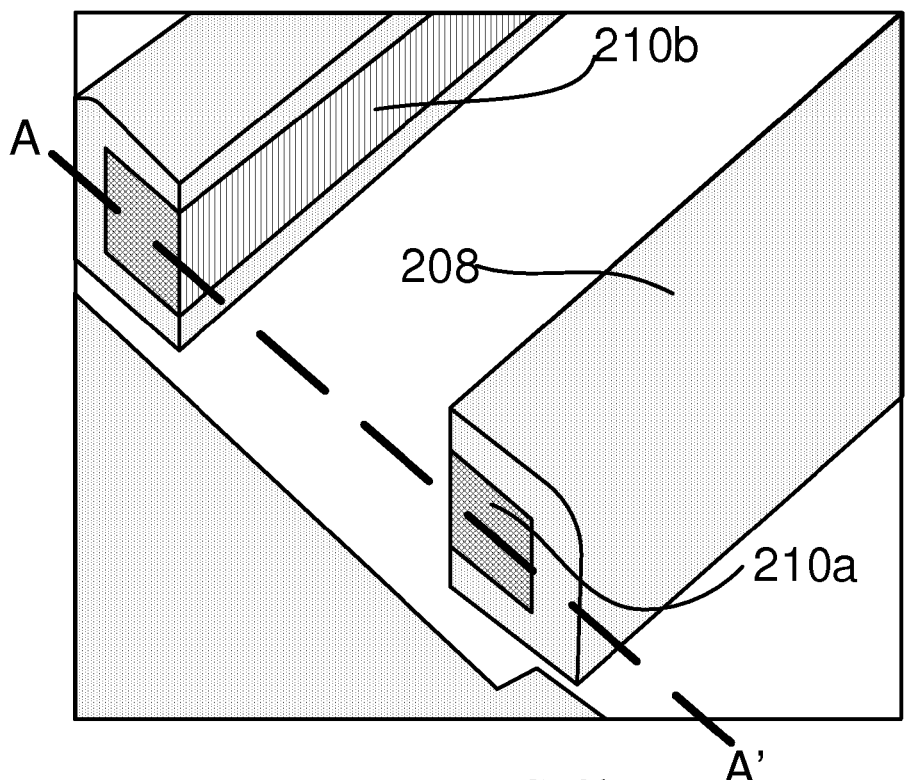
FIG. 2b schematically shows a prong formed in the sample carrier of FIG. 2a, and FIG. 3 schematically shows a sample carrier according to the invention, showing a crystalline part.

FIG. 2b schematically shows the prong formed after coating the base material with a coating 208, and milling away the areas 204 and 206. The two tines 210a and 210b of the prong are in the direction AA' antisymmetric, as the two sides facing each other are mainly made of the base material and the other sides only show the plating material. The tines are thus bimetals bending along line AA' in opposite directions. As a result the distance between the two tines will change when the temperature changes due to thermal expansion difference of the base material (e.g. copper) and the coating material (e.g. nickel).

It is noted that in the direction of the mesh the tines are stable as both sides of the base material are covered with the other material, and thus no resultant force outside the plane of the mesh is formed.

Milling the areas 204 and 206 was in a test version done with a focused ion beam, but other fabrication methods, such as laser ablation, are envisaged. Also mechanical cutting is possible, especially for disposing part 204.

Figure 3:
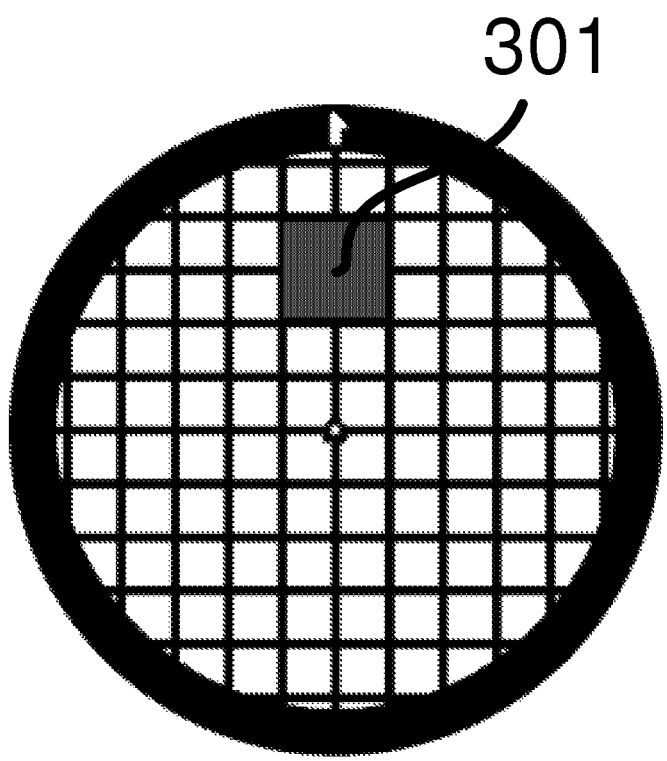

FIG. 3 schematically shows a sample carrier according to the invention, showing a crystalline part 301 that is transparent when inspected in a TEM. The crystalline part is formed from a material that shows one or more phase changes in a temperature range of interest. As an example $SrTiO_3$, a perovskite, can be used, showing a phase transition at 105 K.

Above this temperature it shows a cubic structure and below said temperature a tetragonal structure.

It is noted that the part 301 can be self supporting, but can also be on a thin film, such as a carbon film or a thin semiconductor film. In the latter case the diffraction pattern shows a superposition of the semiconductor and the perovskite.

It is further noted that, although a diffraction pattern recorded in a TEM or a STEM is normally used for determining the crystal structure, also other techniques, such as determining Kikuchi lines in a SEM, can be used. The advantage of determining Kikuchi lines is that the crystal need not be transparent to electrons, as this relies on the reflection of electrons.

It is mentioned that, although the embodiments discus the invention using cryogenic temperatures, the invention is equally well suited to be used at temperatures close to room temperature, or above. The invention described herein has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for use with the present invention are commercially available, for example, from FEI Company, the assignee of the present application. To the extent that any term is not specially defined in this specification, the intent is that the term is to be given its plain and ordinary meaning. The accompanying drawings are intended to aid in understanding the present invention and, unless otherwise indicated, are not drawn to scale.

Although the description of the present invention above is mainly directed at a method, it should be recognized that an apparatus performing the operation of this method would further be within the scope of the present invention. Further, it should be recognized that embodiments of the present invention can be implemented or controlled via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention also make use of a particle beam apparatus, such as a FIB or SEM, in order to image a sample using a beam of particles. Such particles used to image a sample inherently interact with the sample resulting in some degree of physical transformation.

In the discussion herein and in the claims, the terms "including" and "comprising" are used in an open-ended fashion, and thus should be interpreted to mean "including, but not limited to . . . ." The term "FIB" or "focused ion beam" is used herein to refer to any collimated ion beam, including a beam focused by ion optics and shaped ion beams. Further, throughout the present specification and in the claims, discussions utilizing terms such as "calculating," "determining," "measuring," "generating," "detecting," "forming," "observing," "comparing," or the like, also refer to the action and processes of a computer system, or similar electronic device, that manipulates and transforms data represented as physical quantities within the computer system into other data similarly represented as physical quantities within the computer system or other information storage, transmission or display devices.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of determining the temperature of a sample carrier in a charged particle-optical apparatus, the method comprising observation of the sample carrier with a beam of charged particles, the observation of the sample carrier giving information about the temperature of the sample carrier.

2. The method of claim 1 in which the observation results in information of the relative position of two parts of the sample carrier, the relative position being temperature dependent as a result of thermal expansion or shrinking of one or more solids.

3. The method of claim 2 in which a part of the sample carrier is composed of at least two materials with different expansion coefficients, as a result of which the part shows temperature dependent deformation.

4. The method of claim 3 in which the part of the sample carrier is composed of at least two metals and the part behaves as a bimetal strip.

5. The method of claim 1 in which the sample carrier comprises a crystalline part that, within a temperature range of interest, shows one or more phase transitions or segregations, and in which the observation results in information of the phase or phase segregation of the crystalline part of the sample carrier.

6. The method of claim 1 in which the observation comprises the observation of luminescence, the luminescence induced by irradiating at least part of the sample carrier with charged particles, and the observation results in information about the colour and/or the decay time of the luminescence, said colour and/or decay time being temperature dependent.

7. The method of claim 6 in which the sample carrier comprises two fluorescent materials showing fluorescence at different colours, the ratio of the luminosity of the colours and/or the decay times associated with each colour being temperature dependent, and the method comprising comparing the luminosity or decay time of the two or more fluorescent materials.

8. The method of claim 1 in which the observation comprises observing the deflection of a beam of charged particles by a part of the sample carrier, the part of the sample carrier having a potential as a result of irradiation with charged particles, thus giving information about the resistance of the material of the sample carrier.

9. The method of claim 1 in which the observation gives information about the strain induced in the material of at least part of the sample carrier.

10. The method of claim 9 in which the strain is determined using a diffraction pattern in a transmission electron microscope or in a scanning transmission electron microscope.

11. The method of claim 1 in which the temperature measurement is the measurement whether the sample has a temperature above or below a predetermined temperature.

12. The method of claim 11 in which the predetermined temperature is determined by a reference position of two parts of the sample carrier, or a phase transition of a part of the sample carrier.

13. A sample carrier for performing the method of claim 2 in which the sample carrier shows at least one free standing strip comprised of at least two materials with different thermal expansion coefficients, as a result of which the strip shows different forms for different temperatures.

14. A sample carrier in a charged particle-optical apparatus, the sample carrier showing a crystalline part, the crystalline part showing one or more phase changes in a temperature range of interest.

15. The sample carrier of claim 14 in which the crystalline part is selected from a group comprising of perovskites.

16. The sample carrier of claim 15 in which the crystalline part comprises $SrTiO_3$.

17. The sample carrier of claim 15 in which the crystalline part comprises $Na_{0.5}CoO_2$.

* * * * *